(12) United States Patent
St. Amand

(10) Patent No.: US 8,890,337 B1
(45) Date of Patent: *Nov. 18, 2014

(54) COLUMN AND STACKING BALLS PACKAGE FABRICATION METHOD AND STRUCTURE

(71) Applicant: Amkor Technology, Inc., Chandler, AZ (US)

(72) Inventor: Roger D. St. Amand, Tempe, AZ (US)

(73) Assignee: Amkor Technology, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 14/152,035

(22) Filed: Jan. 10, 2014

Related U.S. Application Data

(63) Continuation of application No. 13/236,916, filed on Sep. 20, 2011, now Pat. No. 8,633,598.

(51) Int. Cl.
| | |
|---|---|
| *H01L 23/48* | (2006.01) |
| *H01L 23/52* | (2006.01) |
| *H01L 29/40* | (2006.01) |
| *H01L 23/28* | (2006.01) |
| *H01L 23/00* | (2006.01) |

(52) U.S. Cl.
CPC ............... *H01L 24/17* (2013.01); *H01L 23/28* (2013.01)
USPC .......................................... 257/778; 257/782

(58) Field of Classification Search
CPC ............... H01L 23/49816; H01L 2224/81192; H01L 21/563; H01L 2224/73204
USPC .................. 257/782, 783, 778, 686, 777, 701
See application file for complete search history.

(56) References Cited

U.S. PATENT DOCUMENTS

| | | | |
|---|---|---|---|
| 3,868,724 | A | 2/1975 | Perrino |
| 3,916,434 | A | 10/1975 | Garboushian |
| 4,322,778 | A | 3/1982 | Barbour et al. |
| 4,532,419 | A | 7/1985 | Takeda |
| 4,642,160 | A | 2/1987 | Burgess |
| 4,645,552 | A | 2/1987 | Vitriol et al. |
| 4,685,033 | A | 8/1987 | Inoue |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Sheila V Clark
(74) *Attorney, Agent, or Firm* — McAndrews, Held & Malloy, Ltd.

(57) ABSTRACT

Stacking balls are formed on ball terminals prior to application of an underfill under a flip chip mounted electronic component. The underfill is then applied and directly contacts and at least partially encloses an inner row of the stacking balls closest to and directly adjacent the flip chip mounted electronic component. By forming the stacking balls prior to the application of the underfill, contamination of the ball terminals by the underfill is avoided. This allows the spacing between the ball terminals and the electronic component to be minimized.

24 Claims, 8 Drawing Sheets

(56) References Cited

U.S. PATENT DOCUMENTS

| | | |
|---|---|---|
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,578,934 A | 11/1996 | Wood et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,721,496 A | 2/1998 | Farnworth et al. |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,915,977 A | 6/1999 | Hembree et al. |
| 5,924,003 A | 7/1999 | Slocum |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,239 A | 3/2000 | Akram et al. |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,461 B1 | 4/2003 | Hembree et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 6,987,314 B1 | 1/2006 | Yoshida et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,129,113 B1 | 10/2006 | Lin et al. |
| 7,185,426 B1 | 3/2007 | Hiner et al. |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,732,912 B2 | 6/2010 | Damberg |
| 7,777,351 B1 | 8/2010 | Berry et al. |

(56) References Cited

U.S. PATENT DOCUMENTS

| | | |
|---|---|---|
| 7,825,520 B1 | 11/2010 | Longo et al. |
| 7,960,827 B1 | 6/2011 | Miller, Jr. et al. |
| 8,294,279 B2 | 10/2012 | Chen et al. |
| 8,300,423 B1 | 10/2012 | Darveaux et al. |
| 8,341,835 B1 | 1/2013 | Huemoeller et al. |
| 8,482,134 B1 | 7/2013 | Darveaux et al. |
| 8,525,318 B1 | 9/2013 | Kim et al. |
| 8,633,598 B1 * | 1/2014 | St. Amand ............ 257/778 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0082657 A1 | 4/2005 | Tago |
| 2005/0139985 A1 | 6/2005 | Takahashi |
| 2005/0242425 A1 | 11/2005 | Leal et al. |
| 2007/0216008 A1 | 9/2007 | Gerber |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0230887 A1 | 9/2008 | Sun et al. |
| 2012/0038064 A1 * | 2/2012 | Camacho et al. ............ 257/777 |
| 2012/0104590 A1 * | 5/2012 | Do et al. ............ 257/690 |
| 2012/0133053 A1 | 5/2012 | Lo et al. |
| 2012/0273960 A1 * | 11/2012 | Park et al. ............ 257/774 |
| 2012/0292738 A1 | 11/2012 | Lin et al. |
| 2013/0154076 A1 * | 6/2013 | Camacho et al. ............ 257/676 |

FOREIGN PATENT DOCUMENTS

| | | |
|---|---|---|
| JP | 07-017175 | 11/1995 |
| JP | 08-190615 | 7/1996 |
| JP | 10-334205 | 12/1998 |

OTHER PUBLICATIONS

Kim et al., "Application of Through Mold via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

\* cited by examiner

Underfill contacting stacking balls package fabrication method 100

COLUMN AND STACKING BALLS PACKAGE FABRICATION METHOD AND STRUCTURE

CROSS-REFERENCE TO RELATED APPLICATIONS/INCORPORATION BY REFERENCE

The present application is a continuation of U.S. application Ser. No. 13/236,916, titled UNDERFILL CONTACTING STACKING BALLS PACKAGE FABRICATION METHOD AND STRUCTURE, filed Sep. 20, 2011, presently pending, which is hereby incorporated herein in its entirety by reference.

TECHNICAL FIELD

The present application relates to the field of electronics, and more particularly, to methods of forming electronic component packages and related structures.

BACKGROUND

To form an electronic component package, an electronic component is flip chip mounted to flip chip terminals on a substrate core with flip chip solder bumps. An underfill is applied between the electronic component and the substrate core and encloses the flip chip solder bumps.

To prevent the underfill from bleeding on to and contaminating ball terminals within the vicinity of the flip chip mounted electronic component, the ball terminals are spaced a sufficient distance from the flip chip mounted electronic component. For a fixed pattern of ball terminals, this required spacing fundamentally limits the allowable size of the flip chip mounted electronic component placed within the confines of the ball terminals.

BRIEF DESCRIPTION OF THE DRAWINGS

In the following description, the same or similar elements are labeled with the same or similar reference numbers.

DETAILED DESCRIPTION

Figure 4:
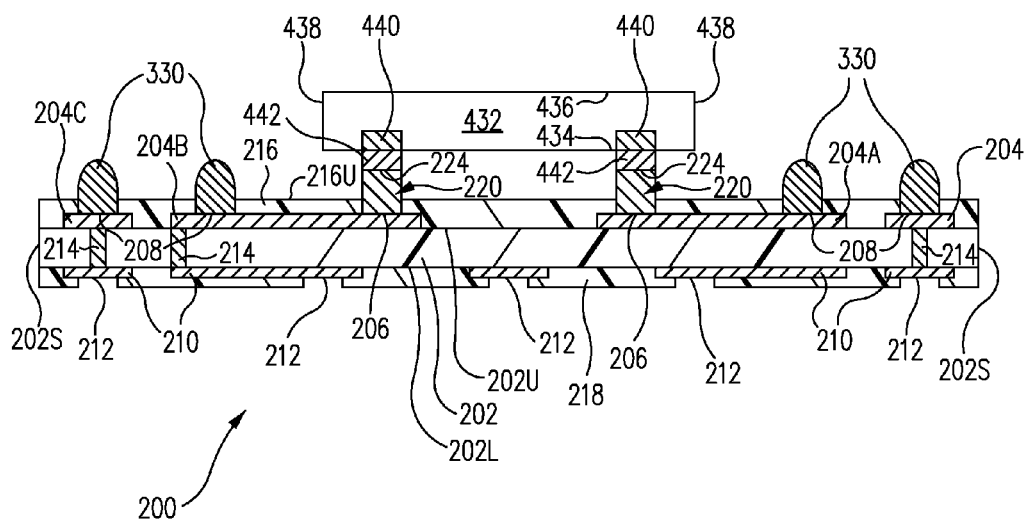
Figure 5:
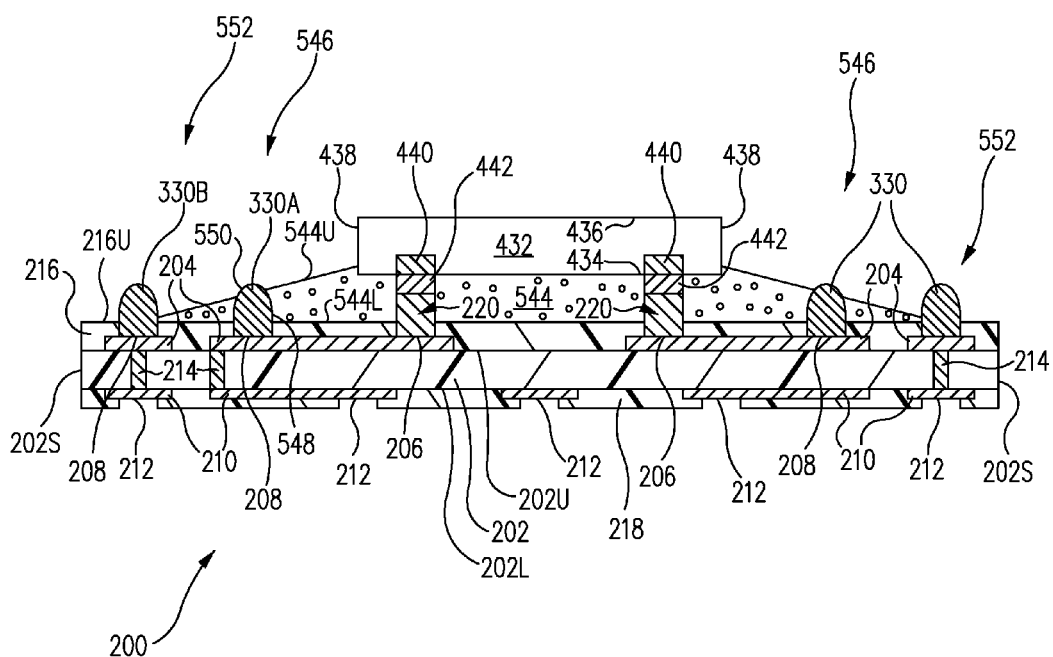

As an overview and in accordance with one embodiment, referring to FIGS. 4 and 5 together, stacking balls 330 are formed on ball terminals 208 prior to application of an underfill 544 under a flip chip mounted electronic component 432. Underfill 544 is then applied and directly contacts and a least partially encloses an inner row 546 of stacking balls 330 closest to and directly adjacent electronic component 432.

By forming stacking balls 330 prior to the application of underfill 544, contamination of ball terminals 208 by underfill 544 is avoided. This allows the spacing between ball terminals 208 and electronic component 432 to be minimized.

More particularly, for a fixed pattern of ball terminals 208, the minimal spacing required between ball terminals 208 and electronic component 432 enables a maximum allowable size of electronic component 432 to be placed within the confines of a fixed pattern of ball terminals 208. In accordance with another embodiment, for a fixed size electronic component 432, the spacing between ball terminals 208 and electronic component 432 can be minimized thus resulting in a minimal overall size for underfill contacting solder balls package 200.

Figure 1:
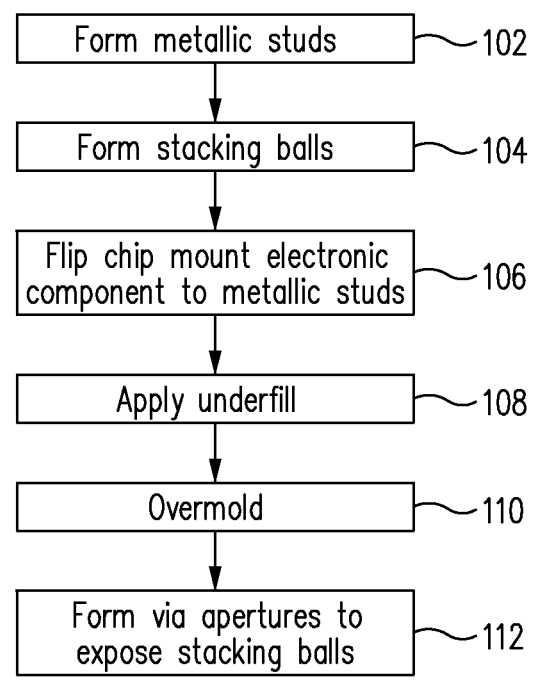
FIG. 1 is a block diagram of an underfill contacting stacking balls package fabrication method in accordance with one embodiment.
Figure 2:
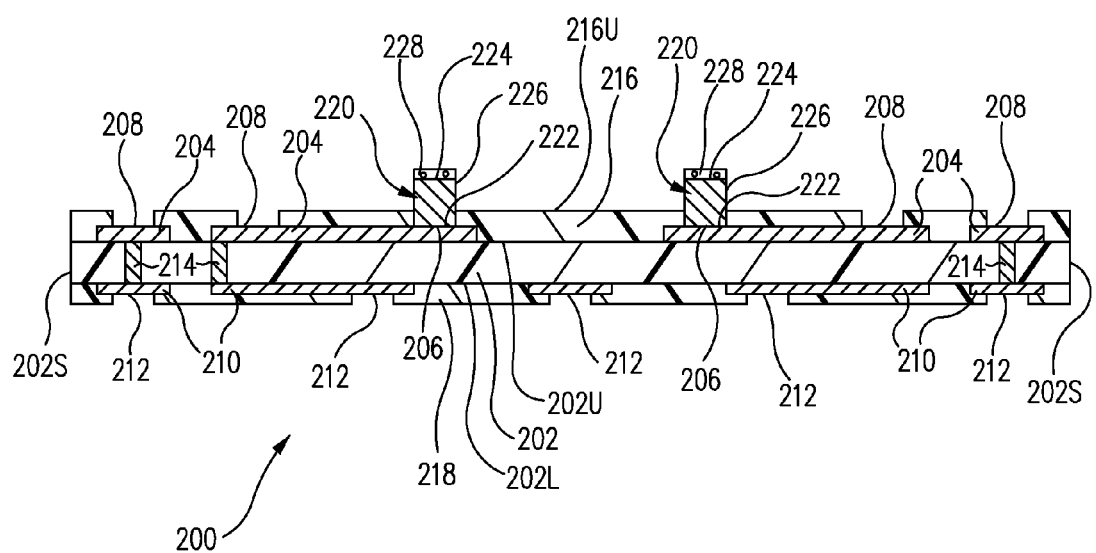
FIG. 2 is a cross-sectional view of an underfill contacting stacking balls package during fabrication in accordance with one embodiment.

Now in more detail, FIG. 1 is a block diagram of an underfill contacting stacking balls package fabrication method 100 in accordance with one embodiment. FIG. 2 is a cross-sectional view of an underfill contacting stacking balls package 200 during fabrication in accordance with one embodiment.

Underfill contacting stacking balls package 200, sometimes called an electronic component package, includes a substrate core 202 including an upper, e.g., first, surface 202U and an opposite lower, e.g., second, surface 202L. Substrate core 202 further includes sides 202S extending perpendicularly between upper surface 202U and lower surface 202L. Substrate core 202 is a dielectric material such as laminate, ceramic, printed circuit board material, or other dielectric material.

Although the terms parallel, perpendicular, and similar terms are used herein, it is to be understood that the described features may not be exactly parallel and perpendicular, but only substantially parallel and perpendicular to within excepted manufacturing tolerances.

Formed on upper surface 202U of substrate core 202 are electrically conductive upper, e.g., first, traces 204, e.g., formed of copper. Upper traces 204 include flip chip terminals 206 and ball terminals 208, sometimes collectively called land openings. Flip chip terminals 206 are sometimes called bond fingers and ball terminals 208 are sometimes called ball pads.

Formed on lower surface 202L of substrate core 202 are lower, e.g., second, traces 210. Lower traces 210 including electrically conductive lands 212.

Lower traces 210 are electrically connected to upper traces 204 by electrically conductive vias 214 extending through substrate core 202 between upper surface 202U and lower surface 202L.

In accordance with this embodiment, underfill contacting stacking balls package 200 further includes a dielectric upper, e.g., first, solder mask 216 on upper surface 202U. Upper solder mask 216 protects, i.e., covers, first portions of upper traces 204 while exposing second portions, e.g., flip chip terminals 206 and ball terminals 208, of upper traces 204.

Underfill contacting stacking balls package 200 further includes a dielectric lower, e.g., second, solder mask 218 on lower surface 202L. Lower solder mask 218 protects, i.e., covers, first portions of lower traces 210 while exposing second portions, e.g., lands 212, of lower traces 210.

Upper and lower solder masks 216, 218 are optional, and in one embodiment, are not formed. Accordingly, although upper and lower solder masks 216, 218 are illustrated in the figures and discussed below, in light of this disclosure, those of skill in the art will understand that the description is equally applicable to upper and lower surface 202U, 202L of substrate core 202 in the event that upper and lower solder masks 216, 218 are not formed.

Although a particular electrically conductive pathway between upper traces 204 and lower traces 210 is described above, other electrically conductive pathways can be formed. For example, contact metallizations can be formed between the various electrical conductors.

Further, instead of straight though vias 214, in one embodiment, a multilayer substrate includes a plurality of vias and/or internal traces that form the electrical interconnection between upper traces 204 and lower traces 210.

Further, lands 212 can be distributed in an array thus forming a Land Grid Array (LGA). In another embodiment, interconnection balls, e.g., solder balls, are formed on lands 212 to provide a Ball Grid Array (BGA). However, in other embodiment, other package configurations other than a LGA and a BGA are used.

In a form metallic studs operation 102, metallic studs 220 are formed on flip chip terminals 206 of upper traces 204. In accordance with one embodiment, metallic studs 220 are formed of an electrically conductive material, e.g., copper, on flip chip terminals 206.

For example, a mask is formed on upper solder mask 216 and patterned to form a positive image of metallic studs 220. The pattern within the mask is filled with an electrically conductive material, e.g., by plating copper, to form metallic studs 220. The mask is then removed.

Metallic studs 220 are metallic protrusions that protrude vertically upwards from flip chip terminals 206 and above upper solder mask 216. Metallic studs 202 include bases 222, tops 224, and sidewalls 226.

Bases 222 are formed directly upon flip chip terminals 206. Tops 224 are the uppermost portion of metallic studs 220 and are located above the plane defined by an upper, e.g., first, surface 216U of upper solder mask 216. Sidewalls 226 extending perpendicularly upward between bases 222 and tops 224.

In one embodiment, metallic studs 220 are cylindrical. In accordance with this embodiment, bases 222 and tops 224 are circular planes and sidewalls 226 are cylindrical. Although metallic studs 220 are described as being cylindrical, in light of this disclosure, those of skill in the art will understand that metallic studs 220 may not be exactly cylindrical, but only substantially cylindrical to within excepted manufacturing tolerances. Illustratively, tops 224 of metallic studs 220 may be slightly rounded or otherwise non-planer.

Further, in another embodiment, metallic studs 220 have a shape other than cylindrical. For example, metallic studs 220 are rectangular, spherical, smooth curves, or other shapes.

Optionally, in form metallic studs operation 102, an organic surface protectant (OSP) 228 and/or a thin metallic layer, is applied to tops 224 and, optionally, to sidewalls 226. Organic surface protectant 228 protects metallic studs 220, e.g., from oxidation, as well as enhances soldering to metallic studs 220 as discussed further below. Metallic studs 220 can be smaller or larger than the openings in upper solder mask 216.

Figure 3:
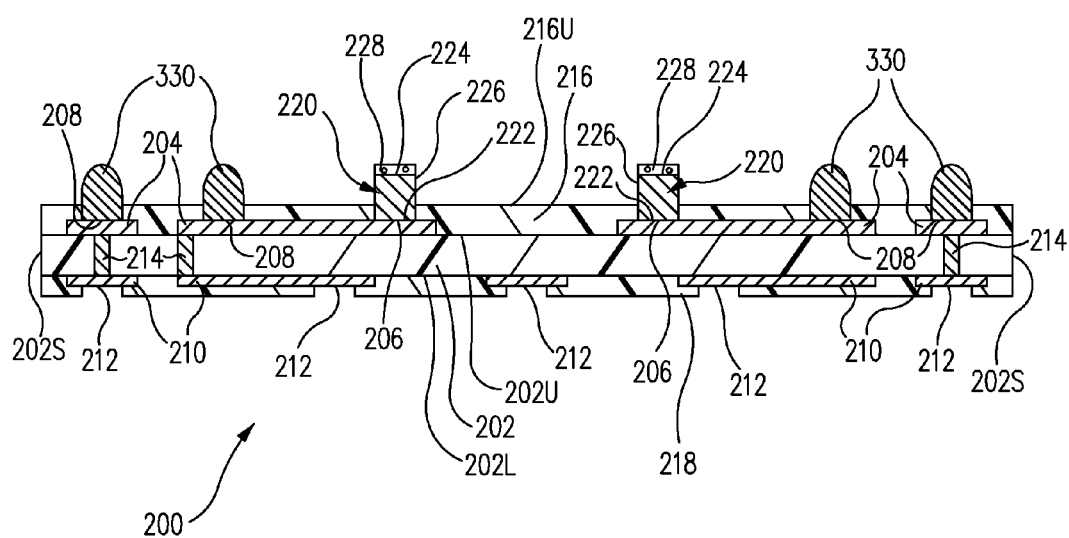
FIGS. 3, 4, 5, 6, and 7 are cross-sectional views of the underfill contacting stacking balls package of FIG. 2 at later stages during fabrication in accordance with various embodiments.

FIG. 3 is a cross-sectional view of underfill contacting stacking balls package 200 of FIG. 2 at a later stage during fabrication in accordance with one embodiment. Referring now to FIGS. 1 and 3 together, from form metallic studs operation 102, flow moves to a form stacking balls operation 104. In form stacking balls operation 104, stacking balls 330 are formed upon ball terminals 208 of upper traces 204.

In accordance with one embodiment, stacking balls 330 are formed of an electrically conductive material, e.g., solder, on ball terminals 208. For example, solder balls are applied to ball terminals 208, e.g., held in place by solder flux. The solder balls are reflowed, i.e., heated to a melt and then cooled to resolidify, thus forming stacking balls 330 mounted to ball terminals 208.

Metallic studs 220 do not melt or otherwise deform during formation of stacking balls 330. Generally, metallic studs 220 are formed of an electrically conductive material, e.g., copper, that has a higher melting temperature than the electrically conductive material, e.g., solder, of stacking balls 330. In this manner, metallic studs 220 are prevented from being deformed during formation of stacking balls 330.

Stacking balls 330 are spherical, or at least curved, and protrude vertically upwards from ball terminals 208 and above upper solder mask 216.

FIG. 4 is a cross-sectional view of underfill contacting stacking balls package 200 of FIG. 3 at a later stage during fabrication in accordance with one embodiment. Referring now to FIGS. 1 and 4 together, from form stacking balls operation 104, flow moves to a flip chip mount electronic component to metallic studs operation 106. In flip chip mount electronic component to metallic studs operation 106, an electronic component 432 is flip chip mounted to metallic studs 220.

In one embodiment, electronic component 432 is an integrated circuit chip, e.g., an active component. However, in other embodiments, electronic component 432 is a passive component such as a capacitor, resistor, or inductor.

In accordance with this embodiment, electronic component 432 includes an active surface 434, an opposite inactive surface 436, and sides 438 extending perpendicularly between active surface 434 and inactive surface 436. Electronic component 432 further includes bond pads 440 formed on active surface 434.

Bond pads 440 are flip chip mounted to metallic studs 220 in flip chip mount electronic component to metallic studs operation 106. More particularly, bond pads 440 are flip chip mounted to metallic studs 220 by electrically conductive metallic stud interconnects 442.

In one embodiment, metallic stud interconnects 442 are solder. Metallic stud interconnects 442 are placed between bond pads 440 and metallic studs 220, e.g., tops 224 thereof including organic surface protectant 238. Metallic stud interconnects 442 are reflowed to physically and electrically connected bond pads 440 to metallic studs 220, e.g., tops 224 thereof. Organic surface protectant 238 is consumed during this reflow.

Illustratively, electronic component 432 is provided as a bumped chip, i.e., includes metallic stud interconnects 442, sometimes called solder bumps, upon bond pads 440.

In accordance with this embodiment, metallic stud interconnects 442 have a lower melting temperature than metallic studs 220. Accordingly, during reflow of metallic stud interconnects 442, metallic studs 220 are not deformed.

Although form stacking balls operation 104 is described above as being performed prior to flip chip mount electronic component to metallic studs operation 106, in other embodiments, form stacking balls operation 104 is performed after, or simultaneously with, flip chip mount electronic component to metallic studs operation 106.

In accordance with one embodiment, one or more of upper traces 204 is not electrically connected to a lower traces 210, i.e., is electrically isolated from lower traces 210, and electrically connected to bond pads 440. To illustrate, a first upper trace 204A of the plurality of upper traces 204 is electrically isolated from lower traces 210 and electrically connected to a respective bond pad 440. In accordance with this embodiment, the respective bond pad 440 electrically connected to upper trace 204A is also electrically isolated from lower traces 210.

In accordance with one embodiment, one or more of upper traces 204 is electrically connected to both bond pads 440 and to lower traces 210. To illustrate, a second upper trace 204B of the plurality of upper traces 204 is electrically connected to a respective bond pad 440 and to one or more lower traces 210.

In accordance with this embodiment, the respective bond pad 440 is electrically connected to upper trace 204B and is also electrically connected to lower traces 210.

In accordance with one embodiment, one or more of upper traces 204 is not electrically connected to a bond pad 440, i.e., is electrically isolated from bond pads 440, and electrically connected to a lower trace 210. To illustrate, a third upper trace 204C of the plurality of upper traces 204 is electrically isolated from bond pads 440 and electrically connected to lower trace(s) 210. In accordance with this embodiment, the respective lower trace(s) 210 electrically connected to upper trace 204C are electrically isolated from bond pads 440.

Although various examples of connections between bond pads 440, upper traces 204, and lower traces 210 are set forth above, in light of this disclosure, those of skill in the art will understand that any one of a number of electrical configurations are possible depending upon the particular application.

FIG. 5 is a cross-sectional view of underfill contacting stacking balls package 200 of FIG. 4 at a later stage during fabrication in accordance with one embodiment. Referring now to FIGS. 1 and 5 together, from flip chip mount electronic component to metallic studs operation 106, flow moves to an apply underfill operation 108. In apply underfill operation 108, a dielectric underfill 544 is applied.

Underfill 544 is applied in the space between electronic component 432 and upper solder mask 216 at sides 438 of electronic component 432. Underfill 544 is pulled between electronic component 432 and upper solder mask 216 due to capillary action and cured, if necessary. Accordingly, underfill 544 entirely contacts active surface 434 of electronic component 432 and directly contacts and encloses metallic studs 220 including metallic stud interconnects 442. Underfill 544 is sometimes called a capillary underfill (CUF).

Due to the relatively small lateral spacing between electronic component 432 and ball terminals 208 including stacking balls 330 thereon, underfill 544 bleeds, i.e., flows, around stacking balls 330. More particularly, underfill 544 extends in a direction parallel with upper surface 202U of substrate core 202 and laterally outwards past sides 438 of electronic component 432. As used herein, lateral is in the direction parallel with upper surface 202U of substrate core 202.

In accordance with one embodiment, underfill 544 directly contacts and at least partially encloses the inner row 546 of stacking balls 330 closest to and directly adjacent electronic component 432. However, depending upon the spacing of stacking balls 330 from electronic component 432 and the degree of bleeding of underfill 544, underfill 544 may contact all of stacking balls 330, or just some of stacking balls 330.

In one embodiment, underfill 544 extends laterally outward from electronic component 432 to sides 202S of substrate core 202. More typically, underfill 544 extends laterally outward from electronic component 432 to be inward of sides 202S of substrate core 202 as illustrated in FIG. 5.

However, by forming stacking balls 330 prior to the application of underfill 544, contamination of ball terminals 208 by underfill 544 is avoided. This allows the spacing between ball terminals 208 and electronic component 432 to be minimized.

More particularly, for a fixed pattern of ball terminals 208, the minimal spacing required between ball terminals 208 and electronic component 432 enables a maximum allowable size of electronic component 432 to be placed within the confines of the fixed pattern of ball terminals 208. For example, as long as the size of electronic component 432 does not cause electronic component 432 to overlie, contact, or otherwise obstruct stacking balls 330, electronic component 432 can be incorporated into underfill contacting solder balls package 200.

In accordance with another embodiment, for a fixed size electronic component 432, the spacing between ball terminals 208 and electronic component 432 can be minimized thus resulting in a minimal overall size for underfill contacting stacking balls package 200.

Paying attention to inner row 546 of stacking balls 330, and particularly to a first stacking ball 330A of stacking balls 330, underfill 544 directly contacts and encloses a lower stacking ball portion 548 of stacking ball 330A directly adjacent and protruding upwards from upper solder mask 216. Underfill 544 does not contact and exposes an upper stacking ball portion 550 of stacking ball 330A.

In accordance with this embodiment, underfill 544 is thickest at electronic component 432 and becomes thinner as the lateral distance from electronic component 432 increases. Stated another way, underfill 544 tapers to become thinner as the lateral distance from electronic component 432 increases. More particularly, the distance in a direction perpendicular to upper surface 202U of substrate core 202 between a lower, e.g., first, surface 544L of underfill 544 and an upper, e.g., second, surface 544U of underfill 544 decreases as the lateral distance in a direction parallel to upper surface 202U of substrate core 202 increases. Lower surface 544L is in direct contact with upper solder mask 216 and upper surface 544U is the exposed outermost surface of underfill 544.

Accordingly, the stacking balls 330 located at a greater lateral distance from electronic component 432 are surrounded in less underfill 544, if surrounded at all, as compared to stacking balls 330 located closer to electronic component 432. To illustrate, stacking ball 330A of inner row 546 is surrounded with more underfill 544 then a second stacking ball 330B of stacking balls 330 of an outer row 552 of stacking balls 330. In one embodiment, underfill 544 does not contact, i.e., completely exposes, second stacking ball 330B and outer row 552 of stacking balls 330.

Figure 6:
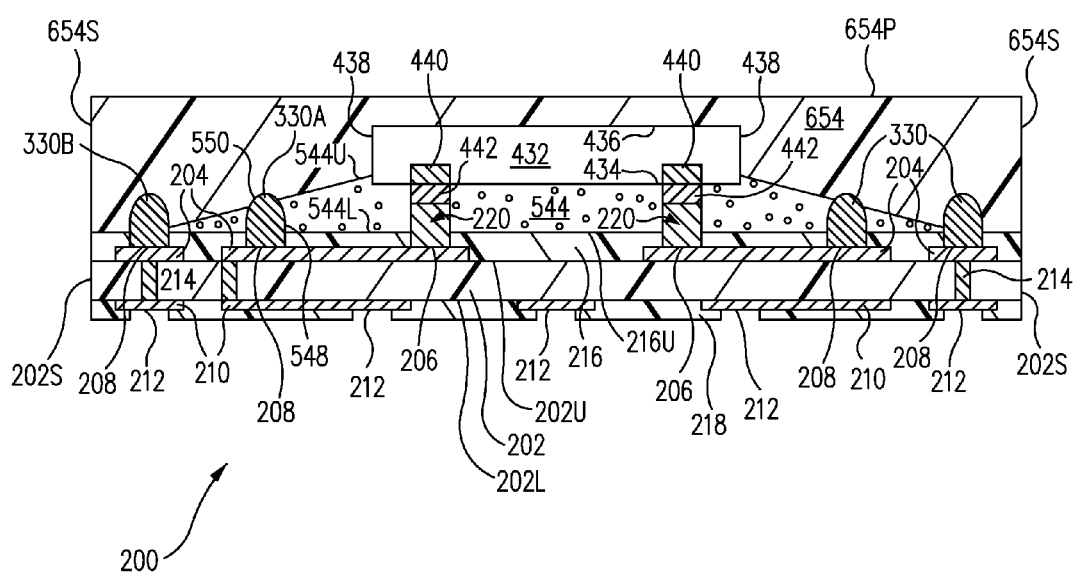

FIG. 6 is a cross-sectional view of underfill contacting stacking balls package 200 of FIG. 5 at a later stage during fabrication in accordance with one embodiment. Referring now to FIGS. 1 and 6 together, from apply underfill operation 108, flow moves to an overmold operation 110. In overmold operation 110, electronic component 432, underfill 544, stacking balls 330, and any exposed portions of upper solder mask 216 are enclosed, sometimes called encased, encapsulated, and/or covered, with a package body 654.

Illustratively, package body 654 is a cured liquid encapsulant, molding compound, or other dielectric material. Package body 654 protects electronic component 432, underfill 544, stacking balls 330, and any exposed portions of upper solder mask 216 from the ambient environment, e.g., from contact, moisture and/or shorting to other structures.

Package body 654 includes a principal surface 654P parallel to upper surface 202U of substrate core 202. In accordance with this embodiment, package body 654 includes sides 654S extending perpendicularly between upper solder mask 216 and principal surface 654P. Sides 654S are parallel to and coplanar with sides 202S of substrate core 202.

Illustratively, underfill contacting stacking balls package 200 is formed simultaneously with a plurality of packages in an array or strip. The array or strip is singulated resulting in sides 654S of package body 654 parallel to and coplanar with sides 202S of substrate core 202. In another embodiment, the array or strip of underfill contacting stacking balls packages 200 is singulated at a later stage during fabrication, e.g., after the stage of fabrication illustrated in FIG. 7. In yet another embodiment, underfill contacting stacking balls package 200 is fabricated individually.

Package body 654 directly contacts and covers inactive surface 436 and at least a portion, or all, of sides 438 of electronic component 432. Further, package body 654 directly contacts and covers upper surface 544U of underfill 544 and the exposed portions of stacking balls 330. Further, package body 654 directly contacts and covers any exposed portions of upper solder mask 216.

Figure 7:
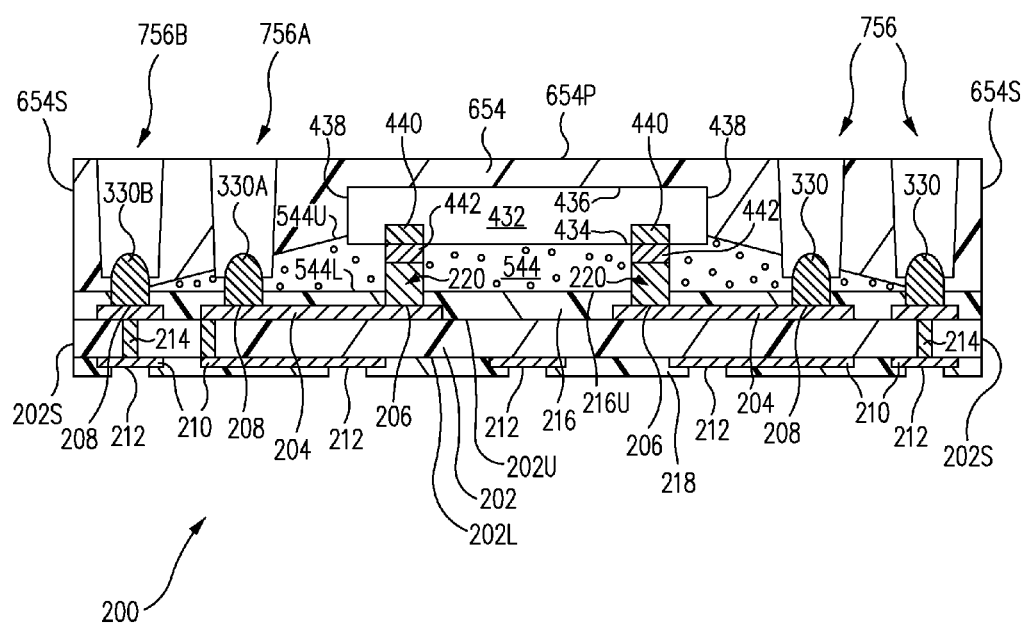

FIG. 7 is a cross-sectional view of underfill contacting stacking balls package 200 of FIG. 6 at a later stage during fabrication in accordance with one embodiment. Referring now to FIGS. 1 and 7 together, from overmold operation 110, flow moves to a form via apertures to expose stacking balls operation 112. In form via apertures to expose stacking balls operation 112, via apertures 756 are formed to expose stacking balls 330. Each via aperture 756 extends to and exposes a respective stacking ball 330.

In accordance with one embodiment, via apertures 756 are formed using a laser ablation process. More particularly, a laser is repeatedly directed perpendicularly at principal surface 654P of package body 654. This laser ablates, i.e., removes, package body 654 and, optionally, underfill 544 to form via apertures 756, sometimes called through holes. Via apertures 756 extend from principal surface 654P through package body 654 to the respective stacking balls 330. In one embodiment, the minimum diameter of via apertures 756 is greater than the maximum diameter of stacking balls 330.

Although a laser-ablation process for formation of via apertures 756 is set forth above, in other embodiments, other via apertures formation techniques are used. For example, via apertures 756 are formed using milling, mechanical drilling, chemical etching and/or other via aperture formation techniques.

In accordance with one embodiment, at least some of via apertures 756 extend entirely through package body 654 and partially into underfill 544. For example, an inner via apertures 756A of via apertures 756 extend entirely through package body 654 and into underfill 544 around stacking ball 330A.

In accordance with another embodiment, at least some of via apertures 756 are formed entirely within package body 654, i.e., do not extend into underfill 544. For example, an outer via apertures 756B of via apertures 756 is formed entirely within package body 654 and around stacking ball 330B. Outer via apertures 756B does not extend into underfill 544.

As discussed above, the thickness of underfill 544 tapers laterally away from electronic component 432. However, the depth of via apertures 756 is uniform, i.e., all of via apertures 756 have the same depth. For example, via apertures 756 extend downward to about the middle of stacking balls 330 in a direction perpendicular to upper surface 202U of substrate core 202. Accordingly, the distance that via apertures 756 extend into underfill 544, if at all, depends upon the thickness of underfill 544 surrounding the respective stacking ball 330.

In another embodiment, package body 654 is not formed. In accordance with the embodiment, overmold operation 110 and form via apertures to expose stacking balls operation 112 are not performed and so are optional operations.

Figure 8:
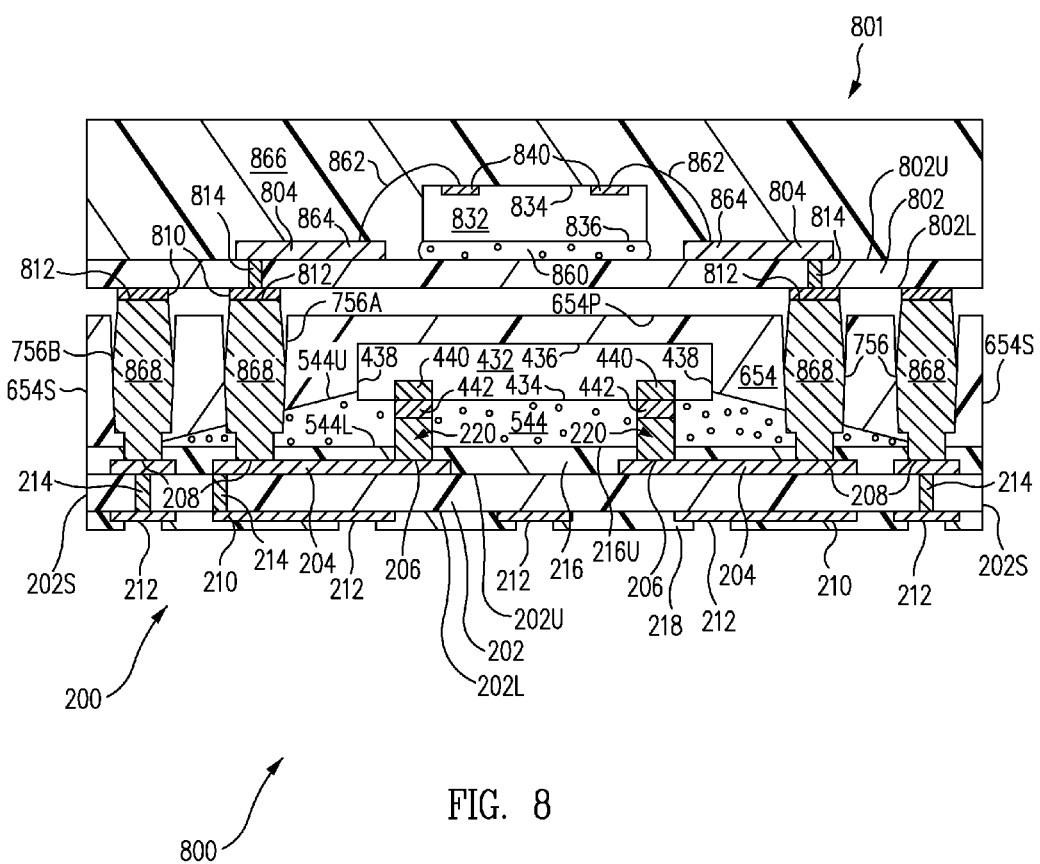
FIG. 8 is a cross-sectional view of a stacked assembly formed with the underfill contacting stacking balls package of FIG. 7 in accordance with one embodiment.

FIG. 8 is a cross-sectional view of a stacked assembly 800 formed with underfill contacting stacking balls package 200 of FIG. 7 in accordance with one embodiment. Referring now to FIG. 8, stacked assembly 800 includes an upper, e.g., second, stacked electronic component package 801 stacked upon underfill contacting stacking balls package 200.

In light of this disclosure, those of skill in the art will understand that upper stacked electronic component package 801 can be any one of a number of different types of electronic component packages. Thus, although a particular upper stacked electronic component package 801 is illustrated in FIG. 8 and discussed below, it is to be understood that the upper stacked electronic component package 801 is illustrative only, and that other electronic component packages and/or electronic components are stacked upon underfill contacting stacking balls package 200 in other embodiments. For example, upper stacked electronic component package 801 includes two electronic components stacked one upon another in a wirebond configuration in another embodiment.

In accordance with this embodiment, upper stacked electronic component package 801 includes a substrate core 802 having upper and lower surfaces 802U, 802L, upper traces 804, lower traces 810 having lands 812, and vias 814 similar to substrate core 202 having upper and lower surfaces 202U, 202L, upper traces 204, lower traces 210 having lands 212, and vias 214 of underfill contacting stacking balls package 200 as described above so the description is not repeated here. Although not illustrated, upper and lower solder masks are formed on upper and lower surfaces 802U, 802L of substrate core 802 in other embodiments.

In accordance with this embodiment, an inactive surface 836 of an electronic component 832 is mounted to upper surface 802U of substrate core 802 by an adhesive 860 in a wirebond configuration. Electronic component 832 further includes an active surface 834 having bond pads 840 form thereon.

Bond wires 862 are formed between bond pads 840 and bond fingers 864 of upper traces 804. Electronic component 832, bond wires 862, upper surface 802U of substrate core 802 including upper traces 804 form thereon are enclosed within a package body 866.

Lands 812 of upper stacked electronic component package 801 are physically and electrically connected to ball terminals 208 of underfill contacting stacking balls package 200 by solder columns 868. More particularly, solder columns 868 extend between lands 812 and ball terminals 208 and through via apertures 756.

In one embodiment, to mount stacked electronic component package 801, solder balls (not shown) on lands 812 of stacked electronic component package 801 are placed within respective via apertures 756 and on the exposed stacking balls 330 therein. Stacked assembly 800 is heated to reflow and fuse the solder balls and stacking balls 330 thus forming solder columns 868.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
   a substrate comprising a first surface;
   first traces coupled to the first surface of the substrate, the first traces comprising flip chip terminals and ball terminals;
   metallic studs coupled to the flip chip terminals;
   stacking balls coupled to the ball terminals, wherein the metallic studs have a higher melting temperature than the stacking balls;
   an electronic component coupled to the metallic studs; and
   an underfill between the electronic component and the first surface of the substrate.

2. The electronic component package of claim 1, wherein the metallic studs each comprise a respective base that is formed directly on a respective one of the flip chip terminals.

3. The electronic component package of claim 1, wherein the metallic studs are plated on the flip chip terminals.

4. The electronic component package of claim 1, wherein the electronic component is coupled to the metallic studs with solder.

5. The electronic component package of claim 1, wherein the stacking balls are non-spherical and comprise a curved top surface.

6. The electronic component package of claim 1, wherein the underfill laterally surrounds at least one of the stacking balls.

7. The electronic component package of claim 1, wherein the underfill contacts all of the stacking balls of the electronic component package.

8. The electronic component package of claim 1, comprising a package body that comprises a via aperture extending to a first one of the stacking balls through the package body and partially into the underfill.

9. The electronic component package of claim 8, comprising a second via aperture extending to a second one of the stacking balls through the package body without extending into the underfill.

10. The electronic component package of claim 1, comprising a package body that comprises a via aperture extending to a first one of the stacking balls through at least the package body, wherein a minimum diameter of the via aperture is greater than a maximum diameter of the first one of the stacking balls.

11. An electronic component package comprising:
a substrate comprising a first surface;
first traces coupled to the first surface of the substrate, the first traces comprising flip chip terminals and ball terminals;
metallic studs formed on the flip chip terminals;
stacking balls coupled to the ball terminals;
an electronic component coupled to the metallic studs; and
an underfill between the electronic component and the first surface of the substrate.

12. The electronic component package of claim 11, wherein the metallic studs are plated on the flip chip terminals.

13. The electronic component package of claim 11, wherein the electronic component is coupled to the metallic studs with solder.

14. The electronic component package of claim 11, wherein the underfill contacts at least one of the stacking balls.

15. An electronic component package comprising:
a substrate comprising a first surface;
first traces coupled to the first surface of the substrate, the first traces comprising flip chip terminals and ball terminals;
metallic studs coupled to the flip chip terminals;
stacking balls coupled to the ball terminals, wherein the stacking balls are non-spherical and comprise a curved top surface;
an electronic component coupled to the metallic studs; and
an underfill between the electronic component and the first surface of the substrate.

16. The electronic component package of claim 15, wherein the metallic studs are formed on the flip chip terminals.

17. The electronic component package of claim 15, wherein the electronic component is coupled to the metallic studs with solder.

18. The electronic component package of claim 15, wherein the underfill contacts at least one of the stacking balls.

19. An electronic component package comprising:
a substrate comprising a first surface;
first traces coupled to the first surface of the substrate, the first traces comprising a flip chip terminal and a ball terminal;
a metallic stud coupled to the flip chip terminal;
a stacking ball coupled to the ball terminal;
an electronic component coupled to the metallic stud;
an underfill contacting the first stacking ball;
a package body enclosing the underfill; and
a first aperture exposing the first stacking ball and extending entirely through the package body and partially into the underfill.

20. The electronic component package of claim 19, wherein the metallic studs are formed on the flip chip terminals.

21. The electronic component package of claim 19, wherein the electronic component is coupled to the metallic studs with solder.

22. The electronic component package of claim 19, wherein the underfill laterally surrounds at least one of the stacking balls.

23. The electronic component package of claim 19, comprising a second via aperture extending to a second one of the stacking balls through the package body and not partially into the underfill.

24. The electronic component package of claim 19, comprising a package body that comprises a via aperture extending to a first one of the stacking balls through at least the package body, wherein a minimum diameter of the via aperture is greater than a maximum diameter of the first one of the stacking balls.

* * * * *